Figure 1:
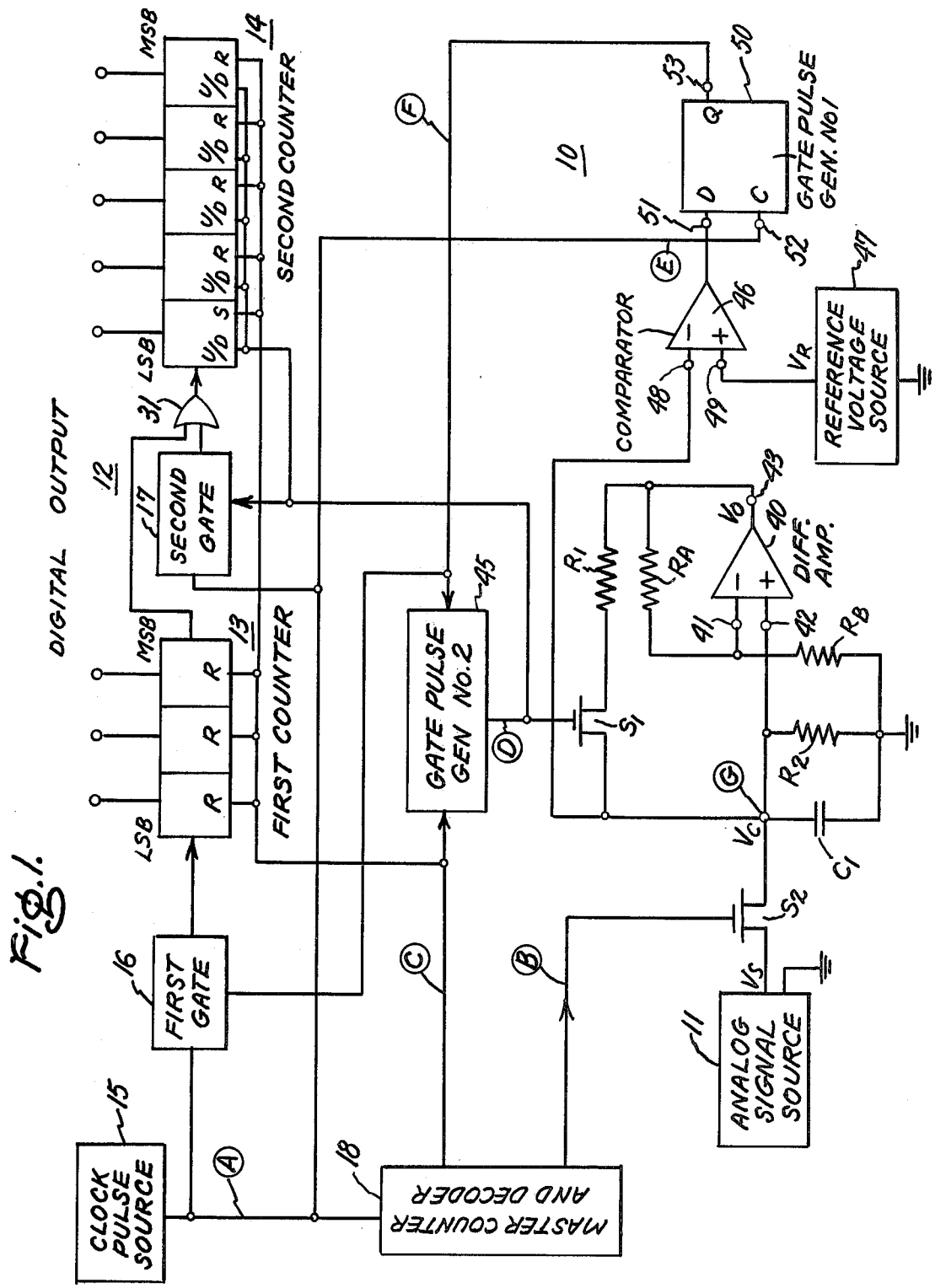

United States Patent [19]

DePuy et al.

[11] 4,190,825
[45] Feb. 26, 1980

[54] LOGARITHMIC ANALOG-TO-DIGITAL CONVERTER

[75] Inventors: Robert P. DePuy, Cherry Hill, N.J.; Arthur H. Leitten, Jr., Syracuse, N.Y.

[73] Assignee: General Electric Company, Schenectady, N.Y.

[21] Appl. No.: 971,188

[22] Filed: Dec. 20, 1978

[51] Int. Cl.² .......................................... H03K 13/20
[52] U.S. Cl. ...................... 340/347 AD; 340/347 NT
[58] Field of Search ................ 340/347 NT, 347 AD, 340/347 M; 324/99 D, 111; 354/24, 23 D; 356/223; 364/722

[56] References Cited
U.S. PATENT DOCUMENTS

| | | | |
|---|---|---|---|
| 3,564,538 | 2/1971 | Bondzeit | 340/347 NT |
| 3,678,506 | 7/1972 | Wheable | 340/347 NT |
| 3,765,012 | 10/1973 | Grutzediek | 340/347 NT |
| 3,828,255 | 8/1974 | Scauon | 340/347 NT |

Primary Examiner—Charles D. Miller
Attorney, Agent, or Firm—Julius J. Zaskalicky; Joseph T. Cohen; Marvin Snyder

[57] ABSTRACT

An analog-to-digital converter is described in which a sequence of samples of an analog signal is converted into a sequence of binary numbers which appear at the output terminals of a composite counter comprising a first counter and a second counter. The first and second counters are gated in sequence by gating waveforms to provide for each sample the count corresponding to the logarithm of the sample. The gating waveforms are derived from a charge and discharge cycle of a capacitor to which the sample is supplied. Selected times in the charging and discharging portions of the cycle are utilized for deriving the gating waveforms.

2 Claims, 8 Drawing Figures

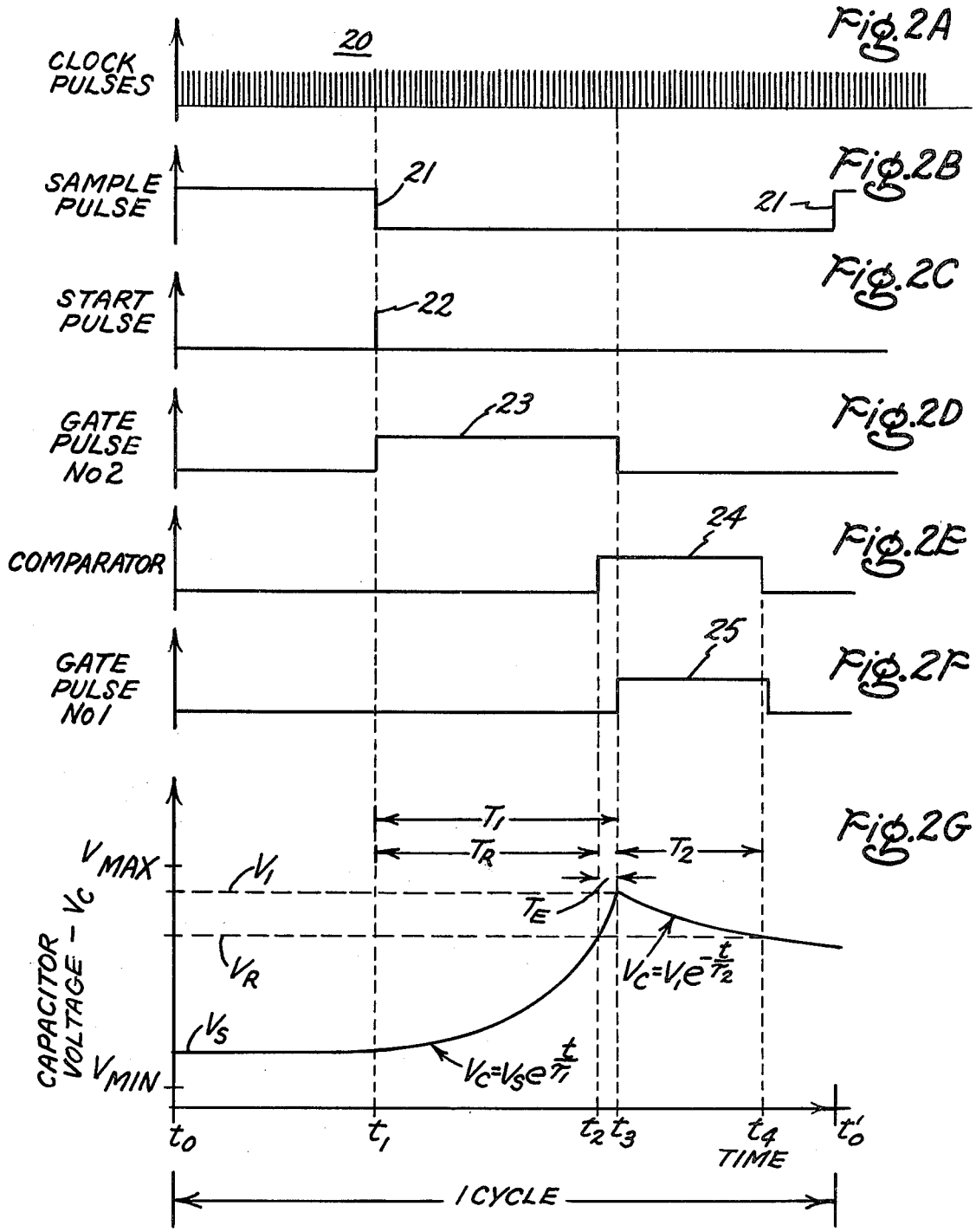

LOGARITHMIC ANALOG-TO-DIGITAL CONVERTER

The present invention relates in general to a converter for converting an analog signal into a digital code corresponding to a logarithm of the signal and in particular relates to a converter for converting a sequence of analog signal samples into a sequence of binary numbers each corresponding to a logarithm of a respective signal sample.

An object of the present invention is to provide a logarithmic converter of large dynamic range and high accuracy over the range which utilizes a minimum number of bits to represent the digital codes.

Another object of the present invention is to provide a logarithmic analog-to-digital converter which is relatively simple, small in size and low in power consumption.

A further object of the present invention is to provide an analog-to-digital converter which converts analog signals into digital codes on an arbitrarily selectable logarithmic base.

In carrying out the present invention in accordance with one illustrative embodiment thereof there is provided a source of clocking pulses, a first binary counter of m stages and a second binary counter of n stages. The first counter is adapted to count in one direction in response to clocking pulses applied to the input thereof. The second binary counter is controllable to count in the one direction and in the opposite direction in response to pulses applied to the input thereof. The first counter and the second counter constitutes a composite counter of m+n stages in which the most significant stage of the first counter is coupled to the least significant stage of the second counter, and in which the least significant stage of the first counter is the least significant stage of the composite counter and the most significant stage of the second counter is the most significant stage of the composite counter. A first gating means is provided for controlling the transmission of clock pulses from the clocking pulse source to the first counter. A second gating means is provided for controlling the transmission of clock pulses from the clocking pulse source to the second counter. A capacitor is provided. A source of reference voltage $V_R$ is provided. Means are provided for supplying the capacitor with a voltage equal to the amplitude $V_S$ of the analog signal sample. Means are provided responsive to a pulse from the clock pulse source for initiating the charging of the capacitor through a charging circuit toward the reference voltage $V_R$. The charging circuit charges the capacitor in accordance with the relationship $$V_C = V_S e^{t/\tau_1},$$

where $V_C$ is the voltage on the capacitor, t is time measured from the occurrence of the pulse, $\tau_1$ is the time constant of the charging circuit. Means are provided responsive to the pulse which initiates the charging of the capacitor for controlling the second counter to count in the aforementioned opposite direction, for presetting the stages of the second counter, for opening the second gating means to allow transmission of clock pulses therethrough to the second counter, and for presetting the stages of the first counter. Means are provided responsive to the pulse from the clock pulse source occurring after the voltage $V_C$ on the capacitor exceeds the reference voltage $V_R$ for terminating the charging of the capacitor by the charging circuit. The latter means performs the additional functions of closing the second gate means and thereby inhibiting the transmission of clock pulses from the clock pulse source therethrough, of opening the first gating means to allow transmission of clock pulses therethrough, of initiating the discharge of the capacitor through a discharge circuit, and of controlling the second counter to count in the aforementioned one direction. The discharge circuit discharges the capacitor in accordance with the relationship $$V_C = V_I e^{-t/\tau_2},$$

where $V_I$ is the voltage on the capacitor at the termination of the charging thereof, t is time measured from the initiation of discharge of the capacitor, and $\tau_2$ is the time constant of the discharging circuit. The ratio of $\tau_2$ to $\tau_1$ is selected to be equal to $2^m$, where m is the number of stages in the first counter. Means are provided responsive to a capacitor voltage $V_C$ equaling reference voltage $V_R$ for closing the second gating means and thereby inhibiting the transmission of clock pulses from the source of clock pulses therethrough. Thus, the count stored in the composite counter is a number corresponding to the logarithm of the analog signal sample.

The novel features which are believed to be characteristic of the present invention are set forth with particularity in the appended claims. The invention itself, both as to its organization and method of operation, together with further objects and advantages thereof, may best be understood by reference to the following description taken in connection with the accompanying drawings wherein:

FIG. 1 shows a schematic diagram of an embodiment of the logarithmic analog-to-digital converter in accordance with the present invention, FIGS. 2A-2G show diagrams of waveforms useful in explaining the operation of the converter apparatus of FIG. 1.

Reference is now made to FIG. 1 which shows an embodiment of a logarithmic analog-to-digital converter in accordance with the present invention. The converter 10 will be described in connection with FIGS. 2A through 2G which show diagrams of waveforms occurring at various points in the apparatus of FIG. 1. The point of occurrence of a waveform of FIGS. 2A through 2G is referenced in FIG. 1 by a literal designation corresponding to the literal designation of the figure reference. In the converter 10 a sequence of samples of an analog signal from a source 11 of analog signals is converted into a sequence of binary numbers or digital codes which appear at the output terminals of a composite counter 12 comprising a first counter 13 and a second counter 14. A clock pulse source 15 provides clock pulses, shown in FIG. 2A, for the first and second counters 13 and 14 and also provides clock pulses to various elements of the apparatus 10 for generating the various timing waveforms utilized in the operation of the apparatus and shown in FIGS. 2B-2G. A first gating means 16 is connected between clock pulse source 15 and the first counter 13 for controlling the transmission of clock pulses from clock pulse source 15 to the first counter 13. A second gate 17 is connected between clock pulse source 15 and the second shift register 14 for controlling the transmission of clock pulses from clock pulse source 15 to the second counter 14. The first and second counters are gated in sequence by appropriate gating waveforms to provide the count corresponding to the logarithm of a sample. The timing waveforms are derived from a charge and discharge cycle of a sampling capacitor $C_I$. The capacitor $C_I$ is provided with an analog sample $V_S$ and is allowed to charge through a charging circuit to voltage reference $V_R$ and beyond to a value $V_I$ and thereafter is allowed to discharge through a discharge circuit to reference voltage $V_R$ and beyond. The times of initiation, crossover and termination in the charging and discharging portions of the cycle are utilized for deriving the timing waveforms for the first and second counters. The voltage on the capacitor $C_I$ over a cycle of operation is shown in FIG. 2G in which the ordinate represents voltage $V_C$ on the capacitor $C_I$ and the abscissa represents time. Along the ordinate of the graph are shown various fixed values including $V_{min}$, $V_{max}$, $V_R$ and $V_I$. $V_{min}$ is the minimum amplitude of the voltage sample. $V_{max}$ is the maximum amplitude of the voltage sample. $V_R$ is the reference voltage utilized in the operation of the circuit. $V_I$ is the voltage appearing on the capacitor $C_I$ at the end of a charging cycle. $V_S$ represents the amplitude of a voltage sample.

An analog signal sample $V_S$ from analog signal source 11 is sampled by the transistor switch $S_2$ having a source to drain conduction path connected between the analog signal source 11 and an electrode of the capacitor $C_1$, the other electrode of which is connected to ground. A resistor $R_2$ is connected in shunt across capacitor $C_1$. The gate of the transistor switch $S_2$ is driven by sampling pulse 21 of FIG. 2B and supplies a voltage $V_S$ to the capacitor $C_I$ prior to the instant $t_1$. At time $t_1$, the charging of capacitor $C_I$ through a charging circuit 19 is initiated by start pulse 22 of FIG. 2C. The voltage $V_C$ on the capacitor rises exponentially according to relationship:

$$V_C = V_S e^{t/\tau_1}, \quad (1)$$

where $t$ is time measured from instant $t_1$, and $\tau_1$ is the time constant of the charging circuit. The voltage $V_C$ rises above reference voltage $V_R$ and is terminated when it reaches voltage $V_1$ corresponding to the occurrence of the clock pulse next succeeding the time at which the voltage on the capacitor $C_1$ equals the reference voltage $V_R$. The time elapsed between the time of initiation of the charging at $t_1$ to the time capacitor voltage $V_C$ equals reference voltage $V_R$ at $t_2$, which is denoted $T_R$, is a logarithmic measure of the amplitude of the voltage sample $V_S$. The interval between $t_1$ and $t_3$, referred to as $T_1$, is a measure of the time $T_R$ with an error $T_E$ which is the interval between $t_2$ and $t_3$. Thus, the value $V_S$ may be approximated by a counter, such as the second counter 14 gated over the interval $T_1$, with a time error $T_E$ which would vary depending upon the time of coincidence of the rising exponential with the voltage reference $V_R$. In accordance with the present invention the error $T_E$ is approximated by discharging the capacitor $C_1$ from the voltage $V_1$ through a discharge circuit having a much larger time constant $\tau_2$ than the time constant $\tau_1$ of the charging circuit. The voltage on the capacitor decays exponentially according to the relationship:

$$V_C = V_1 e^{-t/\tau_2}. \quad (2)$$

The time interval from $t_3$, the time of initiation of the discharge of the capacitor $C_1$, to $t_4$, the time at which the capacitor voltage is coincident with the reference voltage $V_R$ is designated $T_2$. Thus, $T_E$ is equal to $T_2 \times \tau_1/\tau_2$. Accordingly, the provision of a counter of a specified number of stages, the full count of which is equal to $\tau_2/\tau_1$ and gated over the interval $T_2$ would provide a count or measure of the time error $T_E$. This relationship is readily derived from the equation 2 as follows:

$$V_R = V_1 e^{-T_2/\tau_2}, \quad (3)$$

where $T_2$ is the interval in which the voltage $V_C$ decays from value $V_1$ to the value $V_R$. Thus, $$T_2 = \tau_2 \ln(V_1/V_R). \quad (4)$$

From the equation 1 for the rising exponential, it is readily apparent that $$V_1 = V_R e^{-T_E/\tau_1}. \quad (5)$$

Substitution of equation 5 into equation 4 yields the following equation:

$$T_2 = \tau_2 \ln e^{T_E/\tau_1}.$$

Thus, $$T_2 = \tau_2 (T_E/\tau_1). \quad (6)$$

If counter 14 is a counter which is capable of counting both up and down (i.e. bidirectional) and is controlled so that during time interval $T_1$ it counts up and during time interval $T_2$ it counts down, and if counter 13 is a down counter with the most significant stage thereof coupled to the least significant stage of counter 14 and is gated during the interval $T_2$, the count or binary number provided by this composite counter would be a measure of the logarithm of the signal sample $V_S$ supplied to the capacitor $C_1$. The count of the composite counter would vary in an inverse relationship to the amplitude of the sample $V_S$. Of course, prior to initiation of the charging and discharging cycle the stages of the composite counter would be preset. In accordance with a feature of the present invention the provision of a rising exponential which has a short time constant results in a rapid conversion of an analog sample into a logarithmic number.

To provide the functioning described above the output of the second gate 17 is connected to one input of an OR gate 31, the output of which is connected to the least significant stage of second counter 14. The output of the most significant stage of the first counter 13 is connected to another input of OR gate 31. Thus, when second gate 17 is open, clock pulses are passed through to the least significant stage of the second counter. Also, a change of state in the most significant stage of the first counter 13 is passed through the OR gate 31 to the least significant stage of the second counter.

The stages of the second counter 14 are provided with an up-down terminals, designated by the notation U/D. When a high level such as pulse 23 of FIG. 2D appears on the up-down terminals, the second counter 14 is controlled to count up and when a low level appears on the up-down terminals, the second counter 14 is controlled to count down. During the appearance of pulse 23 the second gate 17 is open and the second counter 14 is controlled to count up and to count down at all other times. During the appearance of pulse 25 of FIG. 2F first gate 16 is open and the first counter 13 counts down.

The charging circuit 19 includes a differential amplifier 40 having an inverting terminal 41, a non-inverting terminal 42, and an output terminal 43. A feed-back network is provided consisting of resistance $R_A$ and resistance $R_B$. Resistance $R_A$ is connected between output terminal 43 and inverting terminal 41. The resistance $R_B$ is connected between the inverting terminal 41 and ground. A feed-back resistance $R_1$ is connected between the output terminal 43 and capacitor $C_1$ through the source-to-drain conduction path of transistor switch $S_1$. The gate of transistor switch $S_1$ is connected to gate pulse generator 45 which provides gate pulse 23, shown in FIG. 2D, to the gate of the switch $S_1$. The leading edge of the pulse 23 coincides with the occurrence of the start pulse 22, shown in FIG. 2C. Thus, after time $t_1$ when switch $S_1$ is closed the capacitor $C_1$ is charged through charging circuit 19. The capacitor voltage $V_C$ may be represented by the following equation:

$$V_C = V_S + (1/C_1)\int i\, dt, \quad (7)$$

where $V_C$ is the voltage on capacitor $C_1$, $V_S$ is the voltage on the capacitor $C_1$ at time $t_1$ at the start of the charging cycle, $C_1$ is the capacitance of capacitor $C_1$, and $i$ is the current flow into the capacitor $C_1$.

The current may be represented by the following equation:

$$i = V_0 - V_C/R_1 - V_C/R_2, \quad (8)$$

where $V_0$ is the voltage at the output of the differential amplifier. If the resistors are selected such that $R_2$ is much larger than $(R_1 R_B/R_A)$, equation 8 reduces to the following equation:

$$i = V_0 - V_C/R_1. \quad (9)$$

The output $V_0$ of the differential amplifier 40 may be represented by the following equation:

$$V_0 = G(V_C - R_B/R_A + R_B V_0),$$

or $$V_0(1 + GR_B/R_A + B_B) = G V_C, \quad (10)$$

where G is the gain of the amplifier,
For a high gain amplifier equation 10 reduces to $$V_0 = (R_A + R_B/R_B)V_C,$$

or $$V_0 = A V_C, \quad (11)$$

where A is the amplification of the charging circuit 19. By substitution of equation 11 into equation 9, substitution of the resulting equation into equation 7, and differentiation of resultant equation, the following differential equation is obtained:

$$(d\, V_C/dt) = V_C(A-1)/R_1 C_1 \quad (12)$$

The solution of differential equation 12 is the following equation:

$$V_C = V_S e^{A-1/R_1 C_1 t} \quad (13)$$

By comparing equation 13 with equation 1, it is apparent that $\tau_1 = (R_1 C_1/A - 1)$. $\tau_1$ is referred to as the charging time constant.

The voltage $V_C$ appearing on the capacitor $C_1$ is compared in the comparator 46 with reference voltage $V_R$ provided by reference voltage source 47. One electrode of capacitor $C_1$ is connected to one input terminal 48 of comparator 46. The other input terminal 49 of comparator 46 is connected to the positive terminal of voltage reference source 47. The negative terminal of reference voltage source 47 is connected to ground. The comparator 46 provides output pulse 24, shown in FIG. 2E, the leading edge of which is coincident with time $t_2$ and the trailing edge of which is coincident with the time $t_4$. Gate pulse generator 50 provides a pulse 25, shown in FIG. 2F, having a leading edge coinciding with time $t_3$ and a trailing edge coinciding with the clock pulse next succeeding time $t_4$. Gate pulse generator 50 is shown as a D-type flip-flop having an input terminal 51, a clock terminal 52 and an output terminal 53. The output of the comparator 46 is applied to the input terminal 51 and the output of the clock pulse source 15 is applied to the clock terminal 52. Thus, when the terminal 51 is high, a change in level from low to high is provided on output terminal 53 on the occurrence of the next clock pulse and remains high until the clock pulse following the change in level of terminal 51 to low, at which time the level at output terminal 53 changes to low. Thus, the duration of the output of the gate pulse generator 50 coincides substantially with the interval $T_2$. The leading edge of the output pulse 25 functions to establish the lagging edge of the output pulse 23 of gate pulse generator 45. The time of occurrence of the leading edge of output pulse 25 coincides with time $t_3$, the time at which the capacitor voltage $V_C$ reaches the peak voltage $V_1$. As pulse 23 is applied to the second gate 17 at time $t_3$, second gate 17 is closed and the count stored in the second counter 14 is a measure of the time $T_1$. The output pulse 25 of gate pulse generator 50 is applied to the first gate 16 and enables pulses from the clock pulse source 15 to be transmitted to the first counter 13. The number of pulses transmitted to the first counter 13 depends upon the interval $T_2$. As the first counter is a down counter, this count is subtracted from the total count of the composite counter 12, comprising the first counter 13 and the second counter 14. To provide this result the first stage of the second counter 14 is set so that the bits stored therein represents a full count of the first counter 13. Thus, the down count of the first counter 13 over the interval $T_2$ is subtracted from the total count registered during the interval $T_1$ to provide the proper count corresponding to the interval $T_R$.

The pulse 22 of FIG. 2C is utilized not only for establishing the leading edge of the output pulse 23 of gate pulse generator 45 but is also utilized for resetting all of the stages of the first counter 13, for setting the first stage of the second counter 14 and for resetting all of the other stages of the second counter at the time of start of the charging of the capacitor $C_1$.

A cycle of operation of the converter 10 of FIG. 1 will now be described in connection with FIGS. 2A–2G. During the time interval $t_0$–$t_1$ the closing of switch $S_2$ provides a sample voltage on capacitor $C_1$. At time $t_1$ a start pulse 22 from master counter and decoder 18 is provided to the first counter 13 to reset the stages thereof and is also provided to set the first stage of the second counter and reset the other stages thereof. At time $t_1$ the switch $S_2$ is opened and the switch $S_1$ is closed in response to the application thereto of pulse 23 from gate pulse generator 45 thereby initiating charging of the capacitor $C_1$ through charging circuit 19 and causing the voltage $V_C$ on the capacitor $C_1$ to rise exponentially. When the voltage $V_C$ reaches reference voltage $V_R$, the output of the comparator 46 changes from a low level to a high level, as shown in pulse 24 of FIG. 2E. When the voltage $V_C$ reaches $V_1$ corresponding to the time of occurrence of the next succeeding clock pulse after coincidence of voltages $V_C$ and $V_R$, the output of the gate pulse generator 50 is caused to shift from low level to high level, as shown in pulse 25 of FIG. 2F. The rising edge of pulse 25 is used to shift the gate pulse generator 45 from high level to low level, thus terminating the charging of the capacitor $C_1$ through the charging circuit 19. The voltage $V_C$ on the capacitor $C_1$ is then allowed to decay exponentially through resistance $R_2$. At time $t_4$ at the coincidence of the voltage $V_C$ with reference voltage $V_R$, the level at the output of comparator 46 drops from high level to low level and causes the output of the gate pulse generator 50 also to drop from high level to low level substantially coincident therewith thereby establishing the lagging edge of the pulse 23 of the gate pulse generator 45. As explained above, pulse 23 having the time durating of $T_1$, allows an integral number of clock pulses to be supplied to the second counter 14 which provides a count thereof. The gating pulse 25 of FIG. 2F having a duration of substantially $T_2$ allows a specified number of clock pulses to be supplied to the first counter 13. As the ratio of time constant $\tau_2$ of the discharging circuit to the time constant $\tau_1$ of the charging circuit was selected to be equal to a full count of the first counter 13, the down count of the first counter is a measure of the time error $T_E$ and as the first stage of the second counter is set to represent a full count of the first counter, the resultant count of the first and second counters corresponds to a number representing the interval $T_R$.

While in connection with the converter of FIG. 1 a single analog signal source was shown for the provision of voltage samples $V_S$, it is apparent that voltage samples from a plurality of sources may be applied in sequence to the capacitor $C_1$ and switches may be provided to select the sequencing of the samples.

While the converter of FIG. 1 is shown with a second converter constituted of five stages and a first counter constituted of three stages, the number of stages utilized in each of these counters may be changed, as desired, for example, each of the counters may have the same number of stages. However, the ratio of time constant $\tau_2$ of the discharging circuit to the time constant $\tau_1$ of the charging circuit should equal a full count of the first counter.

While in connection with the converter of FIG. 1 at the start of a conversion of a signal sample to a digital output, the stages of the first counter 13 are reset, the first stage of the second counter 14 is set, and the other stages of the second counter 14 are reset, it is apparent that other starting codes may be provided in the first and second counters, as desired.

While the invention has been described in a specific embodiment, it will be understood that modifications, such as those described above, may be made by those skilled in the art, and it is intended by the appended claims to cover all such modifications and changes as fall within the true spirit and scope of the invention.

What is claimed is:

1. A converter for converting an analog signal sample into a binary number corresponding to a logarithm of the analog signal sample comprising
   a source of clock pulses,
   a first binary counter of m stages, said first counter counting in one direction in response to clocking pulses applied to the input thereof,
   a second binary counter of n stages, said second counter being controllable to count in said one and the opposite direction in response to pulses applied to the input thereof,
   said first counter and said second counter constituting a composite counter of m+n stages in which the most significant stage of said first counter is coupled to the least significant stage of said second counter, and in which the least significant stage of said first counter is the least significant stage of said composite counter and the most significant stage of said second counter is the most significant stage of said composite counter,
   a first gating means for controlling the transmission of clock pulses from said source of clock pulses to said first counter,
   a second gating means for controlling the transmission of clock pulses from said source of clock pulses to said second counter,
   a capacitor,
   a source of reference voltage $V_R$,
   means for providing said capacitor with a voltage equal to the amplitude $V_S$ of said analog signal sample,
   means responsive to a pulse from said source of clock pulses for initiating the charging of said capacitor through a charging circuit toward said reference voltage,
   said charging circuit charging said capacitor in accordance with the relationship $$V_C = V_S e^{t/\tau 1}$$

where $V_C$ is the voltage on said capacitor, t is time measured from the occurrence of said pulse, and $\tau_1$ is the time constant of said charging circuit,
   counter controlling means responsive to said pulse for presetting the stages of said second counter, for controlling said second counter to count in said opposite direction, for opening said second gating means to allow transmission of clock pulses therethrough to said second counter, and for presetting the stages of said first counter,
   means responsive to the pulse from said source occurring after the voltage $V_C$ on said capacitor exceeds said reference voltage $V_R$ for terminating the charging of said capacitor by said charging circuit, for closing said second gate means and thereby inhibiting the transmission of clock pulses from said souce therethrough, for opening said first gating means to allow transmission of clock pulses therethrough, and for initiating the discharge of said capacitor through a discharging circuit, and for controlling said second counter to count in said one direction,
   said discharging circuit discharging said capacitor in accordance with the relationship $$V_C = V_1 e^{-t/\tau_2},$$

where $V_1$ is the voltage on said capacitor at the termination of the charging thereof, t is measured from initiation of discharge and $\tau_2$ is the time constant of said discharging circuit, the ratio of $\tau_2$ to $\tau_1$ being equal to $2^m$, where m is the number of stages in said first counter, means responsive to the voltage $V_C$ on said capacitor during the discharging thereof equaling the reference voltage $V_R$ for closing said second gating means and thereby inhibiting the transmission of clock pulses from said source therethrough, whereby the count stored in said composite counter is a number corresponding to the logarithm of said analog signal sample.

2. The counter of claim 1 in which said counter controlling means in response to said pulse sets the first stage of said second counter, controls the second counter to count in said opposite direction, opens said second gating means to allow transmission of clock pulses therethrough to said second counter, and resets the stages of said first counter.

* * * * *